United States Patent

Hirakawa

(10) Patent No.: US 9,481,166 B2
(45) Date of Patent: Nov. 1, 2016

(54) PIEZOELECTRIC ELEMENT DRIVE CIRCUIT AND STATE DETECTION METHOD, AND IMAGE RECORDING DEVICE

(71) Applicant: FUJIFILM Corporation, Tokyo (JP)

(72) Inventor: Atsuko Hirakawa, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/067,978

(22) Filed: Mar. 11, 2016

(65) Prior Publication Data

US 2016/0193828 A1 Jul. 7, 2016

Related U.S. Application Data

(63) Continuation of application No. PCT/JP2014/074079, filed on Sep. 11, 2014.

(30) Foreign Application Priority Data

Sep. 17, 2013 (JP) .................. 2013-191950

(51) Int. Cl.
*B41J 2/045* (2006.01)
*H01L 41/04* (2006.01)
*H01L 41/09* (2006.01)

(52) U.S. Cl.
CPC ........... *B41J 2/04541* (2013.01); *B41J 2/0451* (2013.01); *B41J 2/04508* (2013.01); *B41J 2/04581* (2013.01); *H01L 41/042* (2013.01); *H01L 41/0973* (2013.01)

(58) Field of Classification Search
CPC B41J 2/04508; B41J 2/0451; B41J 2/04581; H01L 41/042; H01L 41/0973
See application file for complete search history.

(56) References Cited

U.S. PATENT DOCUMENTS 5,376,854 A 12/1994 Oouchi
5,663,613 A * 9/1997 Yamashita ......... H05B 41/2923
315/225

(Continued)

FOREIGN PATENT DOCUMENTS

| JP | 04-286657 A | 10/1992 |
| JP | 2003-011363 A | 1/2003 |
| JP | 2008-260164 A | 10/2008 |

(Continued)

OTHER PUBLICATIONS

International Search Report issued in PCT/JP2014/074079; mailed Dec. 2, 2014.
Written Opinion issued in PCT/JP2014/074079; mailed Dec. 2, 2014.

*Primary Examiner* — Anh T. N. Vo
(74) *Attorney, Agent, or Firm* — Studebaker & Brackett PC

(57) ABSTRACT

Provided are a piezoelectric element drive circuit and state detection method, and an image recording device which realize state detection of a piezoelectric element inexpensively and with a suppressed circuit scale in a drive circuit for rapidly driving a large-capacity load that uses negative voltage drive. An output potential ($V_{OUT}$) of a boost unit (BST) is detected in a state in which $V_{S\_AMP}$ supplied to an amplification unit (AMP) is set to a voltage lower than a maximum rating of a transistor (FET1) by SW1, supply of $V_{S\_FET}$ to the boost unit (BST) is blocked by SW2, and an individual electrode (28) of a piezoactuator (30) is pulled down to $V_{S\_FET}$ via a resistor (R6).

10 Claims, 7 Drawing Sheets

(56) References Cited

U.S. PATENT DOCUMENTS

| | | | |
|---|---|---|---|
| 8,075,076 B2 * | 12/2011 | Ootsuka | B41J 2/04541 347/12 |
| 8,350,550 B2 * | 1/2013 | Kosaka | G03G 15/80 323/283 |
| 8,549,742 B2 * | 10/2013 | Yamamoto | H01L 41/044 29/836 |
| 2011/0122179 A1 | 5/2011 | Hoisington et al. | |

FOREIGN PATENT DOCUMENTS

| | | |
|---|---|---|
| JP | 2010-214772 A | 9/2010 |
| JP | 2011-521473 A | 7/2011 |
| JP | 2012-236426 A | 12/2012 |

* cited by examiner

PIEZOELECTRIC ELEMENT DRIVE CIRCUIT AND STATE DETECTION METHOD, AND IMAGE RECORDING DEVICE

CROSS-REFERENCE TO RELATED APPLICATIONS

The present application is a Continuation of PCT International Application No. PCT/JP2014/074079 filed on Sep. 11, 2014 claiming priority under 35 U.S.C. 119(a) to Japanese Patent Application No. 2013-191950 filed on Sep. 17, 2013. Each of the above applications is hereby expressly incorporated by reference, in their entirety, into the present application.

BACKGROUND OF THE INVENTION

1. Field of the Invention

The present invention relates to a piezoelectric element drive circuit and state detection method, and an image recording device, and particularly, to a technology for detecting a state of a piezoelectric element that uses negative voltage drive.

2. Description of the Related Art

An inkjet printer in which a piezoelectric element is used as a droplet ejection element that discharges droplets is known. In a piezoelectric element drive circuit, switching of high speed, high voltage, and high current is required.

Meanwhile, in an inkjet printer, since a wiring of the droplet ejection element and an ink flow path are closely arranged, short-circuiting of an electrode due to ink leakage may occur.

When high voltage drive is performed in a state in which the electrode is short-circuited, an excessive current flows through a power supply line. Accordingly, damage to a power field effect transistor (FET) in an output stage of the drive circuit or fuse blowout of a protection element occurs, and the drive circuit does not operate normally. Therefore, in a case where short-circuiting occurs in the piezoelectric element, it is necessary for the drive circuit to operate according to appropriate error processing. Therefore, a method of adding a test circuit for determining a state of a load to the drive circuit, and determining a state of the piezoelectric elements prior to a usual operation has been conventionally adopted.

For example, in JP2008-260164A, a state detection device for a recording head, which provides electrical energy to an energy generation element to eject ink, and includes a drive circuit that drives the recording head, a power input terminal that provides power to this drive circuit, a switch having one side connected to the power input terminal, and the other side connected to a power supply, a resistor having one side connected to the power input terminal and the other side connected to the power supply, and detection means for detecting a state of the recording head by observing a voltage of this resistor, is described. According to this device, it is possible to detect the state of the recording head accurately and rapidly without damaging a circuit of a drive system.

However, in a state determination circuit disclosed in JP2008-260164A, since a state detection resistor is inserted between the power supply lines, a power supply is inevitably common to an amplifier and an output boost circuit. Accordingly, in a case where the circuit is adopted in a circuit of a high-speed, large-capacity load, there is a disadvantage in that performance of a push-pull circuit is not sufficiently exhibited and high-speed, large-amplitude drive is limited. Further, there is a problem in that the power supply line becomes unstable due to a flow of a high current.

SUMMARY OF THE INVENTION

The present invention has been made in view of such circumstances, and an object of the present invention is to provide a piezoelectric element drive circuit and state detection method, and an image recording device which realize state detection of a piezoelectric element inexpensively and with a suppressed circuit scale in a drive circuit for rapidly driving a large-capacity load that uses negative voltage drive.

In order to achieve the above object, an aspect of a piezoelectric element drive circuit includes: a drive unit that feedback-amplifies a drive signal for driving a piezoelectric element that uses negative voltage drive and outputs the resultant drive signal to an individual electrode of the piezoelectric element, the drive unit including an input amplification unit to which the drive signal is input, and an output boost unit in which two complementary transistors having different polarities are push-pull connected; a first power supply unit that supplies a first negative potential to the input amplification unit; a second power supply unit different from the first power supply unit, the second power supply unit supplying a second negative potential to the output boost unit; a first switch that switches the potential supplied to the input amplification unit from the first negative potential to a third negative potential having an absolute value smaller than that of the first negative potential; a second switch that blocks the supply of the second negative potential from the second power supply unit to the output boost unit; a third switch that connects the individual electrode of the piezoelectric element to a fourth negative potential via a first resistive element; and an input unit to which a control signal for switching between a drive mode in which driving of the piezoelectric element is performed and a state detection mode in which detection of a state of the piezoelectric element is performed is input, wherein in the drive mode, the potential supplied to the input amplification unit is set to the first negative potential, the second negative potential is supplied from the second power supply unit to the output boost unit, and the individual electrode of the piezoelectric element is not connected to the fourth negative potential via the first resistive element, and in the state detection mode, the potential supplied to the input amplification unit is set to the third negative potential, the supply of the second negative potential from the second power supply unit to the output boost unit is blocked, and the individual electrode of the piezoelectric element is connected to the fourth negative potential via the first resistive element.

According to this aspect, in the state detection mode, since the potential supplied to the input amplification unit is set to the third negative potential, the supply of the second negative potential from the second power supply unit to the output boost unit is blocked, and the individual electrode of the piezoelectric element is connected to the fourth negative potential via the first resistive element, it is possible to detect a state of the piezoelectric element inexpensively and with a suppressed circuit scale.

It is preferable that the first power supply unit performs feedback control based on a voltage obtained by dividing an output voltage generated from a positive voltage through resistance division and supplies a first negative potential, and the first switch changes a resistance value of the resistance division and switches the first negative potential to the third negative potential. In this case, the first switch may change the resistance value by inserting a resistor in parallel with a resistive element for the resistance division.

Even in a case where a power supply integrated circuit (IC) that performs feedback control based on a voltage obtained by dividing an output voltage generated from a positive voltage through resistance division and supplies a first negative potential is used as the first power supply unit, it is possible to appropriately lower a voltage at the time of state detection.

It is preferable that a potential difference between a ground potential and the third negative potential is smaller than a maximum rating of a gate-source voltage of the transistor. Accordingly, even in a case where short-circuiting occurs in the piezoelectric element, it is possible to prevent damage to the transistor.

The input amplification unit may include an operational amplifier that performs inversion amplification. Accordingly, it is possible to appropriately amplify the drive signal.

It is preferable that the piezoelectric element drive circuit further include an AD converter that outputs a digital signal according to a potential of the individual electrode of the piezoelectric element. Further, the piezoelectric element drive circuit may further include a table for calculating a load resistance of the piezoelectric element from the output digital signal. It is thus possible to appropriately calculate the load resistance of the piezoelectric element.

The fourth negative potential may be the second negative potential supplied by the second power supply unit. Accordingly, the second switch and the third switch can be configured as one switching element.

In order to achieve the above object, an aspect of an image recording device includes a piezoelectric element drive circuit including a drive unit that feedback-amplifies a drive signal for driving a piezoelectric element that uses negative voltage drive and outputs the resultant drive signal to an individual electrode of the piezoelectric element, the drive unit including an input amplification unit to which the drive signal is input, and an output boost unit in which two complementary transistors having different polarities are push-pull connected, a first power supply unit that supplies a first negative potential to the input amplification unit, a second power supply unit different from the first power supply unit, the second power supply unit supplying a second negative potential to the output boost unit, a first switch that switches the potential supplied to the input amplification unit from the first negative potential to a third negative potential having an absolute value smaller than that of the first negative potential, a second switch that blocks the supply of the second negative potential from the second power supply unit to the output boost unit, a third switch that connects the individual electrode of the piezoelectric element to a fourth negative potential via a first resistive element, and an input unit to which a control signal for switching between a drive mode in which driving of the piezoelectric element is performed and a state detection mode in which detection of a state of the piezoelectric element is performed is input, wherein in the drive mode, the potential supplied to the input amplification unit is set to the first negative potential, the second negative potential is supplied from the second power supply unit to the output boost unit, and the individual electrode of the piezoelectric element is not connected to the fourth negative potential via the first resistive element, and in the state detection mode, the potential supplied to the input amplification unit is set to the third negative potential, the supply of the second negative potential from the second power supply unit to the output boost unit is blocked, and the individual electrode of the piezoelectric element is connected to the fourth negative potential via the first resistive element; a recording head having the piezoelectric element that uses negative voltage drive; moving means for relatively moving the recording head and the recording medium; and recording control means for controlling the recording head and recording an image on the recording medium.

According to this aspect, it is possible to appropriately detect the state of the piezoelectric element included in the recording head of the image recording device which records an image on the recording medium.

In order to achieve the above object, an aspect of a state detection method of a piezoelectric element is a state detection method of a piezoelectric element in a piezoelectric element drive circuit including a drive unit that feedback-amplifies a drive signal for driving a piezoelectric element that uses negative voltage drive and outputs the resultant drive signal to an individual electrode of the piezoelectric element, the drive unit including an input amplification unit to which the drive signal is input, and an output boost unit in which two complementary transistors having different polarities are push-pull connected, a first power supply unit that supplies a first negative potential to the input amplification unit, and a second power supply unit different from the first power supply unit, the second power supply unit supplying a second negative potential to the output boost unit, the state detection method including the processes of: switching the potential supplied to the input amplification unit from the first negative potential to a third negative potential having an absolute value smaller than that of the first negative potential; blocking the supply of the second negative potential from the second power supply unit to the output boost unit; pulling down the individual electrode of the piezoelectric element to a fourth negative potential using a first resistive element; and detecting a state of the piezoelectric element in a state in which the potential supplied to the input amplification unit is set to the third negative potential, supply of the second negative potential from the second power supply unit to the output boost unit is blocked, and the individual electrode of the piezoelectric element is pulled down to the fourth negative potential using the first resistive element.

According to this aspect, since the load resistance of the piezoelectric element is detected in a state in which the potential supplied to the input amplification unit is set to the third negative potential, the supply of the second negative potential from the second power supply unit to the output boost unit is blocked, and the individual electrode of the piezoelectric element is connected to the fourth negative potential via the first resistive element, it is possible to detect a state of the piezoelectric element inexpensively and with a suppressed circuit scale.

According to the present invention, it is possible to detect a load state of the piezoelectric element inexpensively and with a suppressed circuit scale.

DESCRIPTION OF THE PREFERRED EMBODIMENTS

Preferred embodiments of the present invention will be described in detail according to the accompanying drawings.

[Structure of Ink-Jet Head]

Figure 1A:
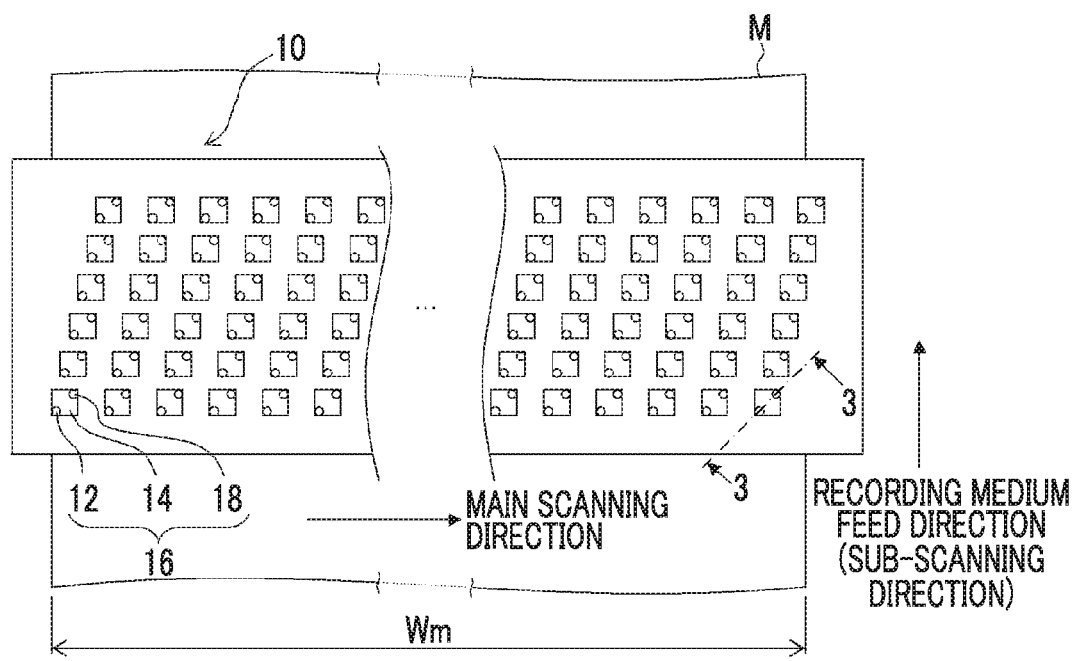
FIG. 1A is a diagram illustrating a structure example of an ink-jet head.
Figure 1B:
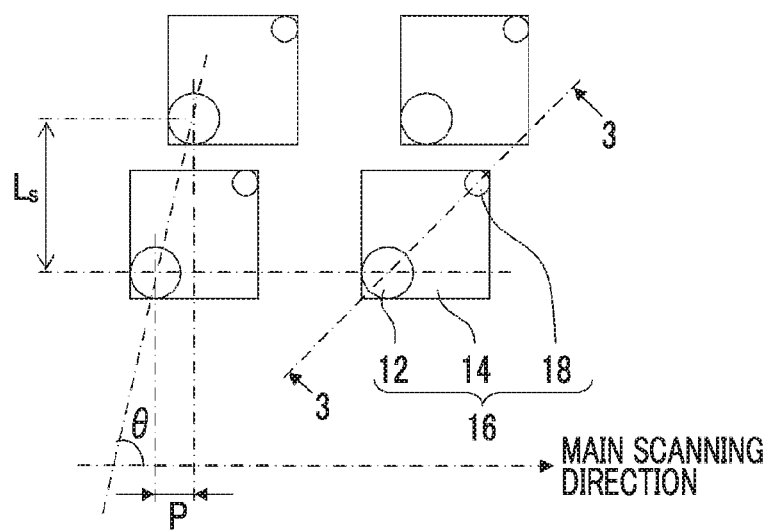
FIG. 1B is a diagram illustrating a structure example of the ink-jet head.
Figure 2A:
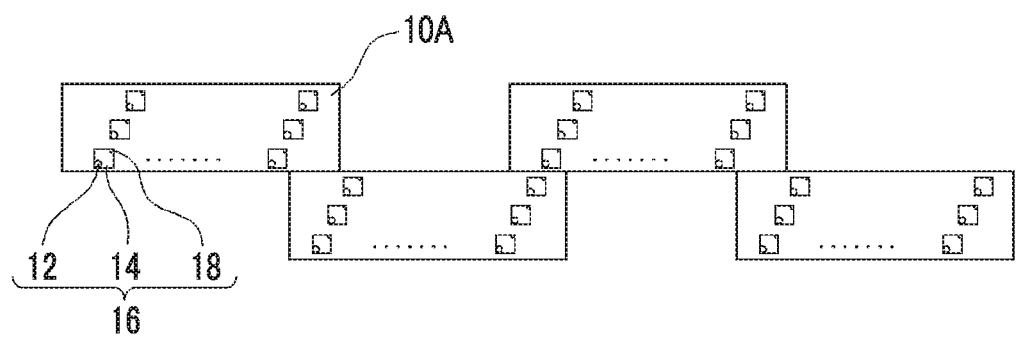
FIG. 2A is a diagram illustrating another structure example of the ink-jet head.
Figure 2B:
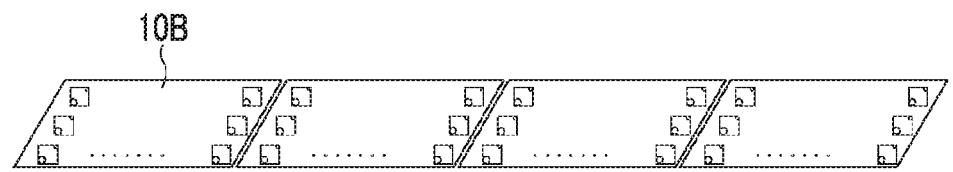
FIG. 2B is a diagram illustrating another structure example of the ink-jet head.
Figure 3:
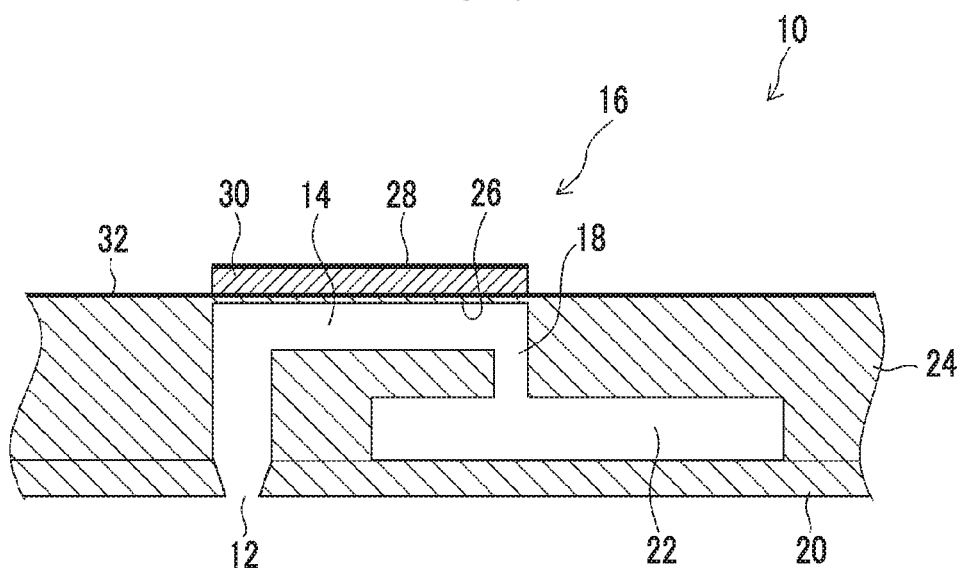
FIG. 3 is a sectional view illustrating a three-dimensional configuration of a droplet ejection element.

A structure of an ink-jet head according to this embodiment will first be described. FIG. 1A is a perspective plan view illustrating a structure example of the ink-jet head 10, and FIG. 1B is a partial enlarged view thereof. Further, FIGS. 2A and 2B are perspective plan views illustrating another structure example of the ink-jet head 10, and FIG. 3 is a sectional view illustrating a three-dimensional configuration of a droplet ejection element (ink chamber unit corresponding to one nozzle 12) for one channel which is a recording element unit (sectional view taken along a line 3-3 in FIGS. 1A and 1B).

As illustrated in FIG. 1A, the ink-jet head 10 has a structure in which a plurality of ink chamber units (droplet ejection elements) 16 each including, for example, a nozzle 12 which is an ink ejection port, and a pressure chamber 14 corresponding to each nozzle 12 are two-dimensionally arranged in a matrix form. Accordingly, reduction of substantial nozzle intervals (projection nozzle pitch) projected (orthogonally projected) to be aligned in a longitudinal direction (direction perpendicular to a sheet feed direction) of the ink-jet head 10 is achieved.

An aspect in which a nozzle array having a length equal to or greater than a length corresponding to a total width Wm of a drawing area of the recording medium M is formed in a direction (main scanning direction) approximately perpendicular to a feed direction (sub-scanning direction) of the recording medium M is not limited to this example. For example, in place of the configuration in FIG. 1A, there is an aspect in which a line head having a nozzle array having a length corresponding to a total width of the recording medium M is formed by arranging short head modules 10A including a plurality of two-dimensionally arranged nozzles 12 in a staggered manner and connecting the short head modules 10A, as illustrated in FIG. 2A, or an aspect in which head modules 10B are connected side by side in a row, as illustrated in FIG. 2B.

In the pressure chamber 14 provided to correspond to each nozzle 12, a plan shape of the pressure chamber 14 is a schematic square (see FIGS. 1A and 1B), an outlet to the nozzle 12 is provided at one of both corner portions on a diagonal line, and an inlet (supply port) 18 of supplied ink is provided at the other corner portion. The shape of the pressure chamber 14 is not limited to this example, and the plan shape may include various forms such as a quadrangle (for example, rhombus or rectangle), a pentagon, a hexagon, other polygons, a circle, ad an oval.

As illustrated FIG. 3, the ink-jet head 10 has a structure in which, for example, a nozzle plate 20 in which the nozzles 12 are formed, and a flow path plate 24 in which the pressure chamber 14 and a flow path such as a common flow path 22 are formed are laminated and bonded.

The flow path plate 24 is a flow path forming member that constitutes a sidewall of the pressure chamber 14 and forms the supply port 18 which is a throttle portion (most stenosis unit) of an individual supply path that guides ink from the common flow path 22 to the pressure chamber 14. Further, for convenience of description, although simply illustrated in FIG. 3, the flow path plate 24 is one plate or has a structure in which a plurality of substrates are laminated.

The nozzle plate 20 and the flow path plate 24 can be machined in a required shape through a semiconductor manufacturing process using silicon as a material.

The common flow path 22 is in communication with an ink tank (not illustrated) serving as an ink supply source, and the ink supplied from the ink tank is supplied to each pressure chamber 14 through the common flow path 22.

A piezoactuator 30 (an example of the piezoelectric element) including an individual electrode 28 is bonded to a vibration plate 26 constituting some surfaces (a top surface in FIG. 3) of the pressure chamber 14. The vibration plate 26 in this example functions as a common electrode 32 corresponding to a lower electrode of the piezoactuator 30.

For the individual electrode 28, the piezoactuator 30, and the common electrode 32, a lower electrode layer is first formed as the common electrode 32, a piezoelectric film that is the piezoactuator 30 is formed on the lower electrode layer using a sputtering method, and an upper electrode layer that is the individual electrode 28 is formed on the piezoelectric film.

The piezoelectric film formed using the sputtering method as above has spontaneous polarization from the lower electrode layer to the upper electrode layer. In this embodiment, the piezoactuator 30 is used as a piezoelectric element that uses negative voltage drive in which a ground potential (ground (GND) potential) is applied to the common electrode 32 and a negative potential is applied to the individual electrode 28 to drive the piezoactuator 30.

By applying a drive signal of the negative potential to the individual electrode 28, the piezoactuator 30 is deformed, capacity of the pressure chamber 14 is changed, and accordingly, the ink is ejected from the nozzle 12 due to a change in the pressure.

A large number of ink chamber units 16 having such a structure are arranged in a lattice shape in a certain arrangement pattern in a row direction along the main scanning direction and an oblique column direction having a constant angle θ which is not a right angle with respect to the main scanning direction as illustrated in FIG. 1B, thereby realizing a high density nozzle head in this example. In such a matrix arrangement, when a distance between the adjacent nozzles in a sub-scanning direction is Ls, the matrix arrangement can be treated as an equivalent arrangement in which the respective nozzles 12 are substantially arranged in a linear shape at a constant pitch $P=Ls/\tan θ$ in the main scanning direction.

An array form of the nozzles 12 is not limited to the illustrated example and various nozzle array structures can be applied. For example, a linear nozzle array, a V-shaped nozzle array, or a line-shaped nozzle array such as a zigzag (W-shaped) nozzle array in which a V-shaped array is a repetition unit is possible.

[Piezoactuator Drive Circuit, and at the Time of Drive]

Figure 4:
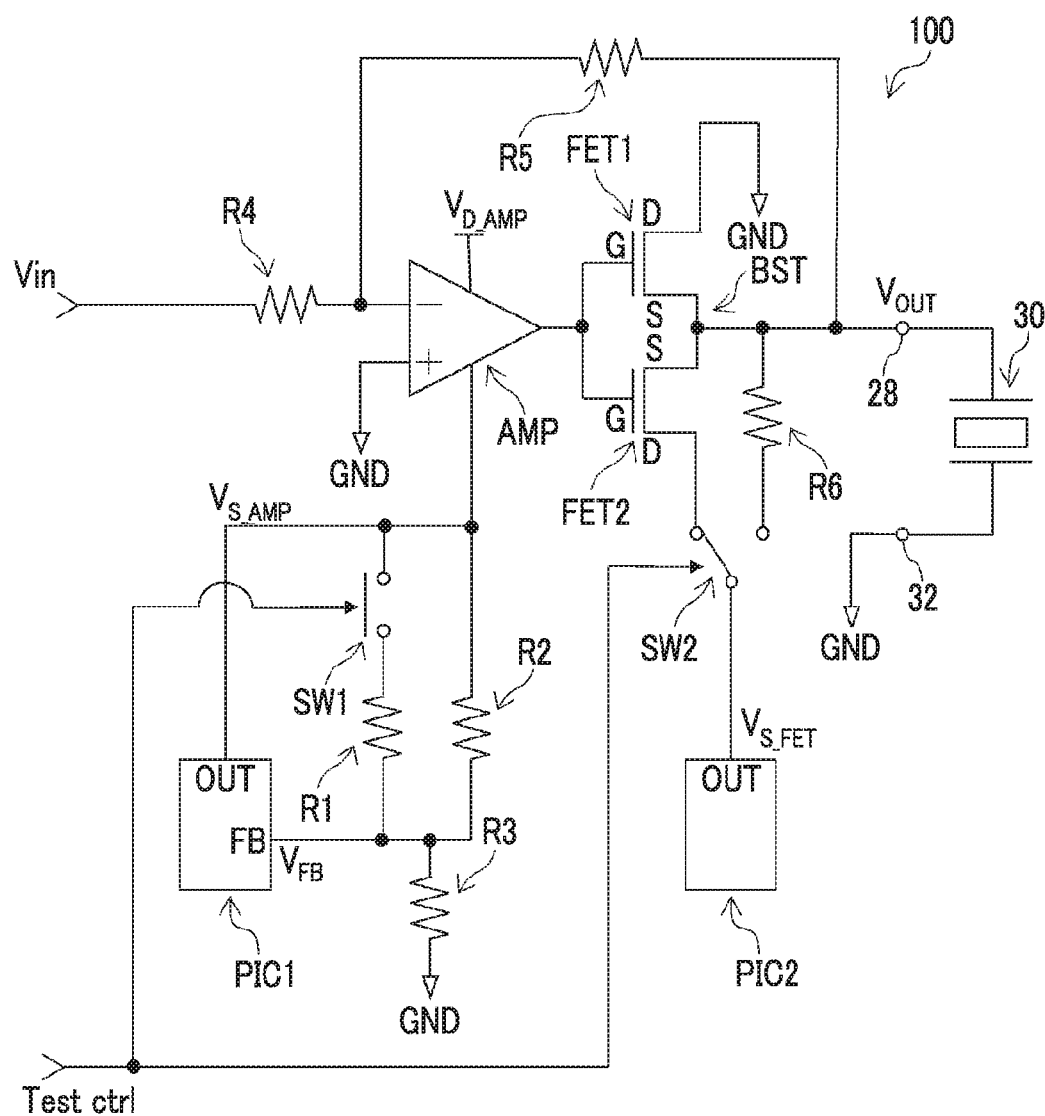
FIG. 4 is a diagram illustrating an example (at the time of drive) of a piezoactuator drive circuit.

FIG. 4 is a diagram illustrating an example of a piezoactuator drive circuit 100 for driving one piezoactuator 30. The piezoactuator drive circuit 100 includes, for example, input terminals Test_ctrl (TC) and Vin, constant voltage sources PIC1 and PIC2, an amplification unit AMP, transistors FET1 and FET2, resistances R1 to R6, and switches SW1 and SW2, as illustrated in FIG. 4.

The input terminal TC (input unit) is a terminal to which a switching signal (an example of a control signal) for switching between a drive mode (at the time of drive) in which the piezoactuator 30 is driven and ink is discharged from the nozzle 12 (see FIGS. 1A and 1B), and a state detection mode (at the time of state detection) in which a short-circuit state of the piezoactuator 30 is inspected. FIG. 4 illustrates a state in which the drive mode is set.

The input terminal Vin is a terminal to which a drive signal for driving the piezoactuator 30 is input. A voltage signal of 0 V to 5 V varying at, for example, several 10 [kHz] is used as the input drive signal.

The constant voltage source PIC1 (an example of the first power supply unit) is a power supply IC which supplies a voltage to the amplification unit AMP. The constant voltage source PIC1 generates a negative voltage $V_{S\_AMP}$ which is an output voltage from a power supply voltage 12 V (an example of the positive voltage) supplied to the constant voltage source PIC1, and supplies the negative voltage $V_{S\_AMP}$ to a negative power terminal of the amplification unit AMP. This output_voltage is a voltage (an example of feedback control) according to voltage value input to a feedback terminal FB of the constant voltage source PIC1.

Here, the output terminal of the constant voltage source PIC1 is connected to the feedback terminal FB via the resistor R2. Further, the switch SW1 and the resistor R1 connected in series are connected in parallel with this resistor R2. The switch SW1 (an example of the first switch) is a switch of which on (connection)/off (non-connection) is controlled by the input signal from the TC terminal. The switch SW1 is turned off in the drive mode.

Further, this feedback terminal FB is pull-up-connected to a ground potential via the resistor R3.

Thus, a voltage obtained by dividing the output voltage $V_{S\_AMP}$ of the constant voltage source PIC1 using the resistor R2 and the resistor R3 is input to the feedback terminal FB. Therefore, the output voltage (potential of the negative power terminal of the amplification unit AMP) $V_{S\_AMP}$ of the constant voltage source PIC1 is determined as in Equation 1 below from an input voltage $V_{FB}$ of the feedback terminal FB, and resistance values $R_2$ and $R_3$ of the resistors R2 and R3.

$$V_{S\_AMP} = (1 + R_2/R_3) \times V_{FB} \quad \text{(Equation 1)}$$

In this embodiment, the resistance values $R_2$ and $R_3$ of the resistors R2 and R3 are determined, for example, so that $V_{S\_AMP} = -46$ [V](an example of the first negative potential).

The constant voltage source PIC2 (an example of the second power supply unit) is the same power supply IC as the constant voltage source PIC1. The PIC2 outputs the voltage according to the voltage value input to the feedback terminal FB, but the feedback terminal FB and a connection thereof are not illustrated herein.

An operational amplifier that performs inversion amplification is used as the amplification unit AMP (an example of the input amplification unit). $V_{D\_AMP} = 10$ [V] is supplied to a positive power terminal of the amplification unit AMP. Further, a non-inversion input terminal of the amplification unit AMP is connected to a ground potential, and the input terminal Vin is connected to an inversion input terminal via the input resistor R4.

Further, an output terminal of the amplification unit AMP is connected to gate terminals of the transistors FET1 and FET2. The transistors FET1 and FET2 are two complementary transistors having polarities different from each other, the transistor FET1 is a P-channel power metal oxide semiconductor field effect transistor (MOSFET), and the transistor FET2 is an N-channel power MOSFET. For example, FETs in which a maximum rating of a gate-source voltage is 20 [V] is used as the transistors FET1 and FET2.

In the transistors FET1 and FET2, respective source terminals are connected to each other, and a drain terminal of the transistor FET1 is connected to a ground potential, and a drain terminal of the transistor FET2 is connected to the switch SW2. This switch SW2 (an example of the second switch) is a switch controlled by the input signal from the TC terminal. In the drive mode, the switch SW2 connects the drain terminal of the transistor FET2 to a $V_{S\_FET}$ potential (an example of the second negative potential) that is an output potential of the constant voltage source PIC2.

The source terminals of the transistors FET1 and FET2 are connected to an individual electrode 28 of the piezoactuator 30 and are connected to the inversion input terminal of the amplification unit AMP via a feedback resistor R5 (an example of feedback amplification).

Thus, the transistors FET1 and FET2 are push-pull connected, and the negative voltage $V_{S\_FET}$ is supplied thereto, and the transistors FET1 and FET2 constitute a push-pull type boost unit BST (an example of the output boost unit). Further, the amplification unit AMP and the boost unit BST constitute a drive unit that feedback-amplifies the drive signal for driving the piezoactuator 30 that uses negative voltage drive and outputs the resultant drive signal to the piezoactuator 30.

Here, the power supply voltage (output potential of PIC2) $V_{S\_FET}$ of the boost unit BST is −36 [V]. In such a connection, when the boost unit BST is a general constant voltage output circuit and the input voltage of the input terminal Vin is $V_{IN}$, the output voltage $V_{OUT}$ of the boost unit BST can be an output voltage in a range of approximately 0 to −36 [V], as shown in Equation 2 below.

$$V_{OUT} = -(R_5/R_4) \times V_{IN} \quad \text{(Equation 2)}$$

Thus, the piezoactuator drive circuit 100 generates the output signal of 0 to −36 [V] based on the drive signal input from the input terminal Vin and drives the piezoactuator 30.

Further, an output portion of the boost unit BST is configured to be connectable to the $V_{S\_FET}$ potential (an example of the fourth negative potential) via the resistor R6 (an example of the first resistive element) and the switch SW2 (an example of the third switch).

Here, even in a case where the piezoactuator 30 is short-circuited (the individual electrode 28 and the common electrode 32 are short-circuited), if an input voltage $V_{IN}$ of the input terminal Vin is 0 V (ground potential), the output potential of the boost unit BST becomes 0 V and no current flows in the power supply line. However, when a signal having a positive potential is input from the input terminal Vin in a state in which the piezoactuator 30 is short-circuited, a current flows from the individual electrode 28 that becomes at the ground potential to the constant voltage source PIC2 ($V_{S\_FET}$ potential) via the transistor FET2 of the boost unit BST.

Therefore, the piezoactuator drive circuit 100 detects a short-circuit state of the piezoactuator 30 in the state detection mode before driving the piezoactuator 30 in the drive mode.

[Piezoactuator Drive Circuit, and at the Time of State Detection]

Figure 5:
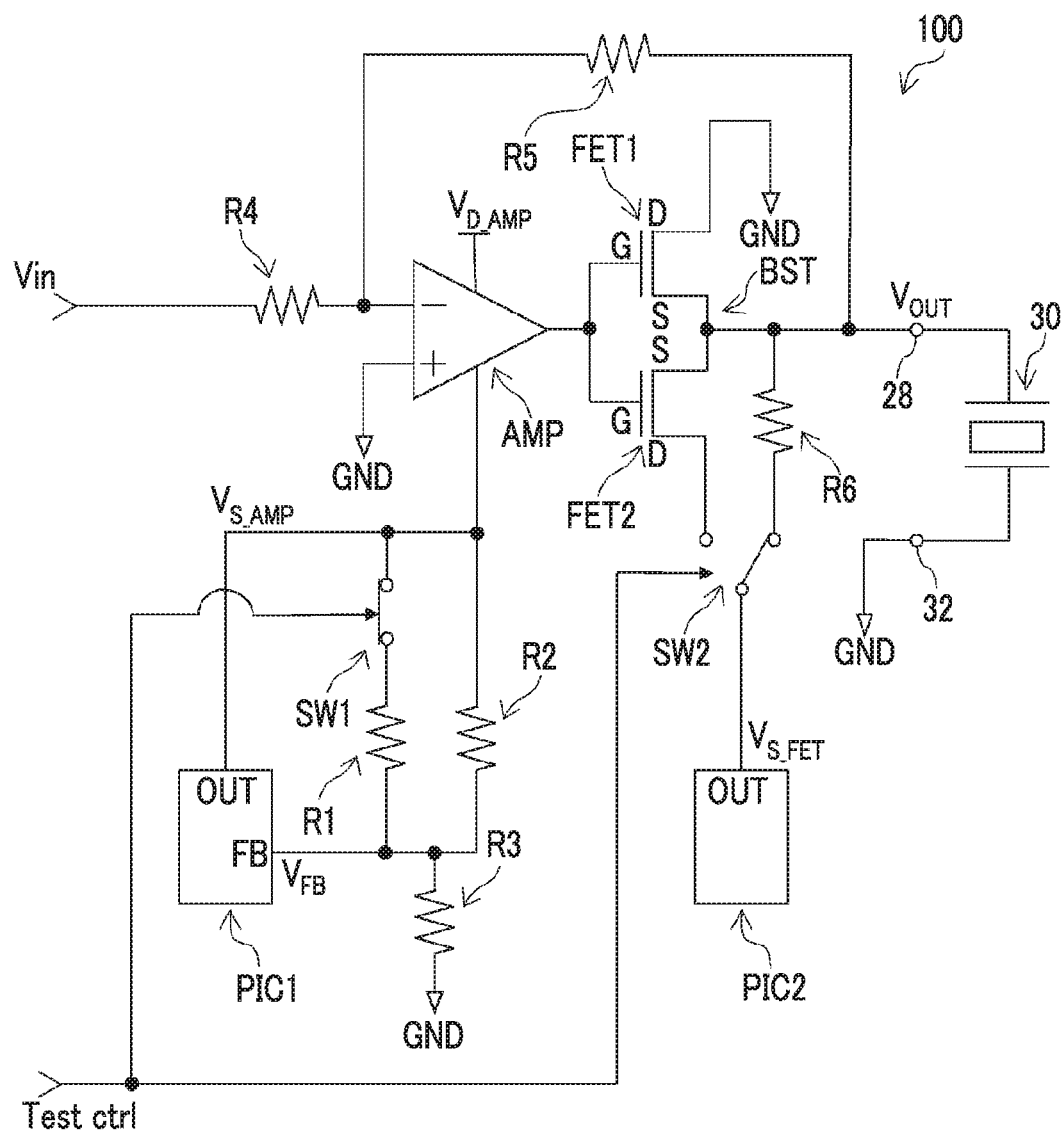
FIG. 5 is a diagram illustrating an example (at the time of state detection) of the piezoactuator drive circuit.

FIG. 5 is a diagram illustrating the piezoactuator drive circuit 100 in the state detection mode, and a connection state of the switches SW1 and SW2 is different from that in the drive mode illustrated in FIG. 4.

In the state detection mode, the switch SW1 is turned on, the resistor R1 is inserted in parallel with the resistor R2, and a resistance value in the resistance division is changed. As a result, a voltage obtained by resistance-dividing the output voltage $V_{S\_AMP}$ of the constant voltage source PIC1 using the resistor R1 and the resistor R2 connected to parallel, and the resistor R3 is input to the feedback terminal FB. In this case, a summed resistance value of the resistor R1 and the resistor R2, $R_1//R_2=R_1 \times R_2/(R_1+R_2)$, is smaller than the resistance value R2 of the resistor R2. Therefore, the potential input to the feedback terminal FB is changed, such that the output voltage $V_{S\_AMP}$ Of the constant voltage source PIC1 can be a voltage (absolute value) smaller than −46 [V] at the time of piezodrive, unlike the case of the drive mode.

A potential supplied to the negative power terminal of the amplification unit AMP in the state detection mode, that is, the output voltage $V_{S\_AMP}$ of the constant voltage source PIC1 is a voltage lower than a maximum rating of a gate-source voltage of the transistors FET1 and FET2. In this embodiment, a resistance value R1 of the resistor R1 is determined so that $V_{S\_AMP}=-10$ [V](an example of the third negative potential).

$V_{D\_AMP}=10$ [V] is supplied to the positive power terminal of the amplification unit AMP, as in the drive mode.

A method of decreasing an absolute value of the potential supplied to the negative power terminal of the amplification unit AMP in the state detection mode is not limited to the above-described example. For example, an aspect in which a resistor inserted in series with the resistor R2 between the $V_{S\_AMP}$ potential and the feedback terminal is short-circuited or an aspect in which a resistor is inserted in series with the resistor R3 between the feedback terminal FB and the ground potential is possible.

Further, in the state detection mode, the switch SW2 (an example of the second switch) causes the drain terminal of the transistor FET2 of the boost unit BST to enter an open state (open) to blocks supply of the $V_{S\_FET}$ potential to the boost unit BST. The drain terminal of the transistor FET2 may be connected to the ground potential.

Further, the switch SW2 pull-down-connects the output portion of the boost unit BST to the $V_{S\_FET}$ potential via the resistor R6. Here, while the output portion is pull-down-connected to the $V_{S\_FET}$ potential, the output portion may be pull-down-connected to another negative potential.

Thus, by disconnecting the power supply line of FET2, the boost unit BST operates in a saturation area, and, as a result, the output potential of the amplification unit AMP is close to the $V_{S\_AMP}$ potential that is a potential of the negative power supply.

In this case, the output potential $V_{OUT}$ of the boost unit BST is determined based on the pull-down voltage $V_{S\_FET}$, a resistance value of each of a load resistor RL of the piezoactuator 30, the resistor R6, the input resistor R4, and the feedback resistor R5, and the potential of the input terminal Vin.

Therefore, it is possible to detect a short-circuit state of the piezoactuator 30 by monitoring the output potential $V_{OUT}$ of the boost unit BST.

Here, when the resistor R6 has a resistance value equal to or greater than a few [kΩ], even in a case where the piezoactuator 30 is short-circuited, a current flowing into the power supply line is limited to a few [mA] or lower. Accordingly, it is possible to prevent the piezoactuator drive circuit 100 from being damaged.

Thus, in this embodiment, $V_{S\_AMP}$ supplied to the amplification unit AMP becomes a voltage lower than the maximum rating of the transistor FET1 by the switch SW1, the supply of $V_{S\_FET}$ to the boost unit BST is blocked by the switch SW2, and the output potential $V_{OUT}$ of the boost unit BST is detected in a state in which the individual electrode 28 of the piezoactuator 30 is pulled down to $V_{S\_FET}$ via the resistor R6 (an example of the state detection method).

Figure 6:
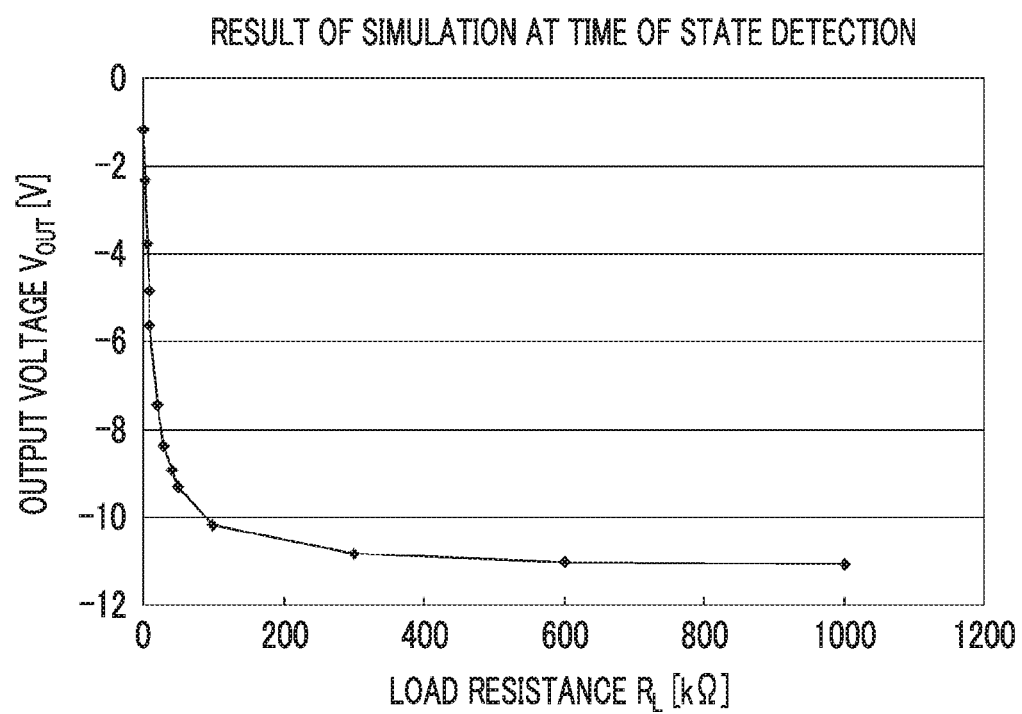
FIG. 6 is a diagram illustrating a relationship between load resistance and an output voltage at the time of state detection.

FIG. 6 is a diagram illustrating a simulation result of a relationship between a resistance value $R_L$ of the load resistor RL of the piezoactuator 30 and the output voltage $V_{OUT}$ at the time of state detection illustrated in FIG. 5. Usually, the piezoactuator 30 has insulation resistance exceeding a few [MΩ], and an approximate value of a decrease in the resistance value can be estimated from the output voltage $V_{OUT}$ in the state detection mode. This output voltage $V_{OUT}$ may be detected by, for example, an analog-digital (AD) converter provided around the drive circuit, and may be converted to the resistance value by a conversion expression or table. It can be seen that in a case where an absolute value of the output voltage $V_{OUT}$ is smaller than −10 V, the resistance value RL of the load resistor RL of the piezoactuator 30 greatly decreases, as illustrated in FIG. 6.

Thus, in this embodiment, by adding the switching switch circuits (switches SW1 and SW2) and the resistors (resistors R1 and R6) to the piezoactuator 30 that uses negative voltage drive, switching of functions between the time of drive and the time of state detection is realized in an inexpensive and small circuit scale.

In this circuit configuration, at the time of the state detection, even in a case where the piezoactuator 30 is short-circuited, a current does not flow to the $V_{S\_FET}$ potential (supply voltage of the boost circuit BST) via the transistor FET2 of the boost unit BST. Further, in the circuit, since the output voltage $V_{OUT}$ is changed according to the resistance value $R_L$ of the load resistor RL of the piezoactuator 30, a load state can be detected safely and appropriately.

Further, at the time of the state detection, the circuit is prevented from being damaged in an irregular circuit connection in a saturation area, such as a short-circuit state of the piezoactuator 30, by lowering the potential (absolute value) of the negative power supply of the amplification unit AMP than a maximum rating of the transistors FET1 and FET2.

Further, by calculating the resistance value of the load resistor from the output voltage, it is possible to monitor a change in the piezoactuator 30 over time. Accordingly, it is possible to detect a change in the state even before the piezoactuator 30 completely leaks. For example, in a case where the resistance value $R_L$ of the load resistor RL of the piezoactuator 30 is smaller than a predetermined threshold, it is possible to make a request for early exchange of the ink-jet head 10 by warning a user.

[Configuration Example of Ink-Jet Recording Device]

Figure 7:
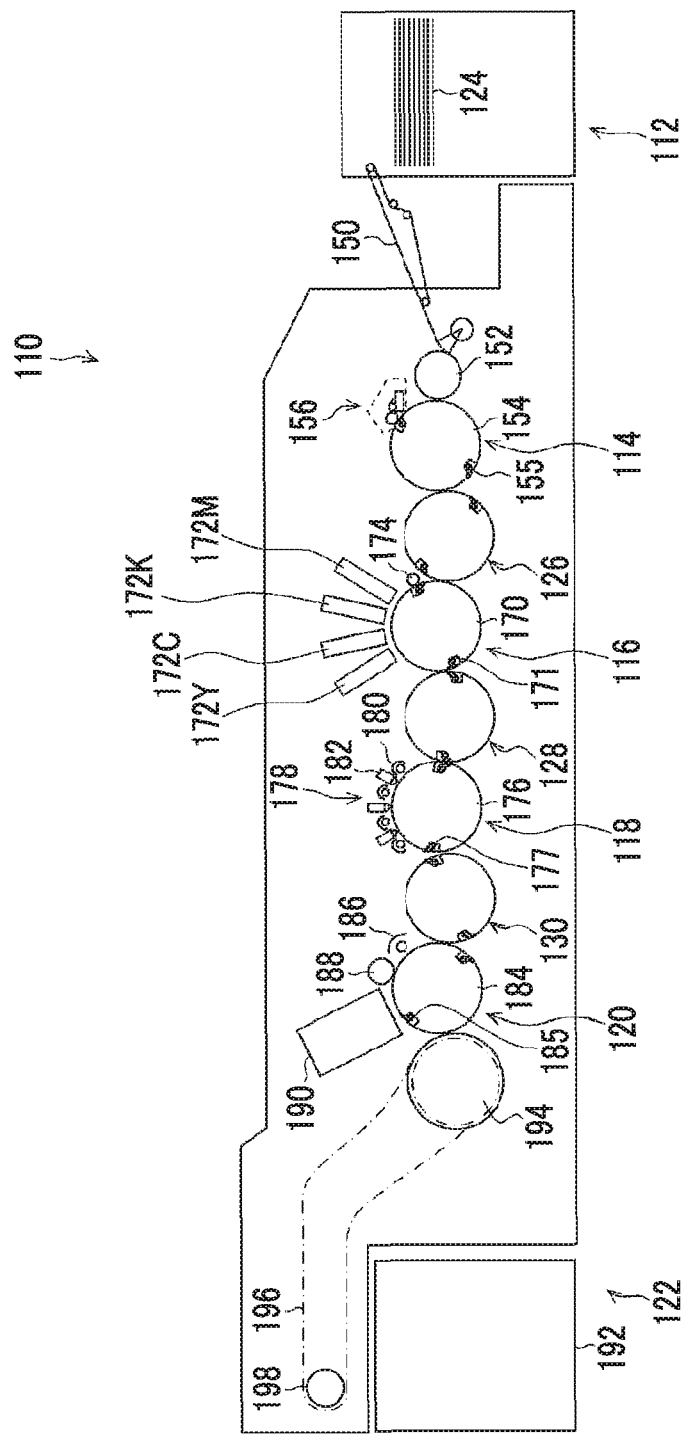
FIG. 7 is an entire configuration diagram illustrating a configuration example of an ink-jet recording device.

FIG. 7 is an entire configuration diagram illustrating a configuration example of an ink-jet recording device (an example of the image recording device) to which the piezoactuator drive circuit 100 according to this embodiment is applied. The ink-jet recording device 110 mainly includes a sheet feed unit 112, a processing liquid providing unit (pre-coating unit) 114, a drawing unit 116, a drying unit 118, a fixing unit 120, and a sheet discharge unit 122, as illustrated FIG. 7.

The ink-jet recording device 110 is an ink-jet recording device using a single pass scheme in which ink with a plurality of colors is ejected from the ink-jet heads 172M, 172K, 172C, and 172Y to the recording medium 124 held in a pressure drum (drawing drum 170) of the drawing unit 116 to form a desired color image, and is an image forming device of an on-demand type to which a 2-liquid reaction (aggregation) scheme in which a processing liquid (here, aggregation processing liquid) is provided on the recording medium 124 prior to ejection of the ink such that the processing liquid reacts to the ink liquid and image formation on the recording medium 124 is performed is applied.

(Sheet Feed Unit)

The recording mediums 124 which are sheets are laminated in the sheet feed unit 112, and the recording medium 124 is fed to the processing liquid providing unit 114 sheet by sheet from a sheet feed tray 150 of the sheet feed unit 112. A plurality of types of the recording mediums 124 having a sheet type or a size (sheet size) may be used as the recording medium 124. An aspect in which a plurality of sheet trays (not illustrated) in which various recording mediums are separately accumulated are included in the sheet feed unit 112, and the sheet sent from the plurality of sheet trays to the sheet feed tray 150 is automatically switched is also possible, or an aspect in which an operator selects the sheet tray as necessary or exchanges the sheet tray is also possible. Further, in this example, while a sheet (cut sheet) is used as the recording medium 124, a configuration in which continuous sheet (rolled sheet) is cut in a necessary size and fed may be adopted.

(Processing Liquid Providing Unit)

The processing liquid providing unit 114 is a mechanism that provides a processing liquid to a recording surface of the recording medium 124. The processing liquid includes a color material aggregation agent that aggregates a color material (in this example, pigment) in the ink provided in the drawing unit 116. This processing liquid comes into contact with the ink, and accordingly, separation of the color material and the solvent of the ink from each other is promoted.

The processing liquid providing unit 114 includes a sheet feed trunk 152, a processing liquid drum (also referred to as a "pre-coating trunk") 154, and a processing liquid coating device 156. The processing liquid drum 154 is a drum that holds, rotates and transports the recording medium 124. The processing liquid drum 154 includes claw-shaped holding means (gripper) 155 on an outer peripheral surface thereof, and the recording medium 124 is interposed between this claw of the holding means 155 and the peripheral surface of the processing liquid drum 154, such that a tip of the recording medium 124 can be held. In the processing liquid drum 154, a suction hole may be provided on an outer peripheral surface thereof and suction means that performs suction from the suction hole may be connected. Accordingly, the recording medium 124 is tightly held on the peripheral surface of the processing liquid drum 154.

The processing liquid coating device 156 is provided to face a peripheral surface of the processing liquid drum 154 on the outside thereof. The processing liquid coating device 156 includes a processing liquid container in which the processing liquid is stored, an anilox roller of which a portion is immersed in the processing liquid of the processing liquid container, and a rubber roller that is pressurized against and brought into contact with the recording medium 124 on the anilox roller and the processing liquid drum 154, and metastasizes the processing liquid after measurement to the recording medium 124. According to this processing liquid coating device 156, it is possible to coat the recording medium 124 with the processing liquid while measuring the processing liquid.

While the configuration in which the coating scheme using the roller is applied has been illustrated in this embodiment, the present invention is not limited thereto, and for example, various schemes such as a spraying scheme, an ink-jet scheme may be applied.

The recording medium 124 to which the processing liquid is provided by the processing liquid providing unit 114 is delivered from the processing liquid drum 154 to the drawing drum 170 of the drawing unit 116 via the intermediate transportation unit 126.

(Drawing Unit)

The drawing unit 116 includes a drawing drum 170 (an example of the movement means), a sheet pressing roller 174, and ink-jet heads 172M, 172K, 172C, and 172Y. The drawing drum 170 includes claw-shaped holding means (gripper) 171 on an outer peripheral surface thereof, similar to the processing liquid drum 154. The recording medium 124 fixed to the drawing drum 170 is transported so that the recording surface thereof is directed outward (an example of relative movement), and ink is provided from the ink-jet heads 172M, 172K, 172C, and 172Y to the recording surface.

Each of the ink-jet heads 172M, 172K, 172C, and 172Y is a recording head using an ink-jet scheme of a full-line type having a length corresponding to a maximum width of an image forming area in the recording medium 124, and has the same configuration as the ink-jet head 10 described with reference to FIGS. 1A and 1B.

An ejection timing of the ink-jet heads 172M, 172K, 172C, and 172Y is synchronized to an encoder (not illustrated) that detects rotation speed, which is arranged in the drawing drum 170. Accordingly, a landing position can be determined with high accuracy.

A droplet of corresponding color ink is ejected from each of the ink-jet heads 172M, 172K, 172C, and 172Y to the recording surface of the recording medium 124 tightly held on the drawing drum 170. Accordingly, the ink comes into contact with the processing liquid, which has been provided to the recording surface by the processing liquid providing unit 114 in advance, a color material (pigment) dispersed in the ink is aggregated, and a color material aggregation body is formed. Accordingly, a flow of the color material, or the like on the recording medium 124 is prevented, and an image is formed on the recording surface of the recording medium 124.

While a configuration of standard colors (four colors) of MKCY has been illustrated in this example, a combination of ink colors or numbers of colors is not limited to this embodiment, and light ink, dark ink, or particular color ink may be added, as necessary. For example, a configuration in which an ink-jet head that ejects light ink such as light cyan or light magenta is added is also possible, and an arrangement order of the respective color heads is not particularly limited.

The recording medium 124 on which the image is formed by the drawing unit 116 is delivered from the drawing drum 170 to the drying drum 176 of the drying unit 118 via an intermediate transportation unit 128.

(Drying Unit)

The drying unit 118 is a mechanism that dries moisture included in a solvent separated by a color material aggregation operation, and includes a drying drum (also referred to as a "dry trunk") 176 and a solvent drying device 178, as illustrated in FIG. 7. The drying drum 176 includes claw-shaped holding means (gripper) 177 on an outer peripheral surface thereof, similar to the processing liquid drum 154, and can hold a tip of the recording medium 124 by this holding means 177.

The solvent drying device 178 is arranged at a position facing the outer peripheral surface of the drying drum 176, and includes a plurality of halogen heaters 180, and a warm wind ejection nozzle 182 arranged between the respective halogen heaters 180.

Various dry conditions can be realized by appropriately adjusting temperature and an amount of wind of warm wind blown from each warm wind ejection nozzle 182 to the recording medium 124, and temperature of each halogen heater 180.

Further, a surface temperature of the drying drum 176 is set to 50° C. or more. By performing heating from a back surface of the recording medium 124, drying is promoted and image damage at the time of fixing can be prevented. Further, an upper limit of a surface temperature of the drying drum 176 is not particularly limited, and the upper limit may be set to 75° C. or less (more preferably, 60° C. or less) from the viewpoint of safety (prevention of burn due to high temperature) of maintenance work such as cleaning of the ink attached to the surface of the drying drum 176.

By drying the recording medium 124 while holding the recording medium 124 on the outer peripheral surface of the drying drum 176 so that the recording surface of the recording medium 124 is directed outward (that is, the recording surface of the recording medium 124 is bent to be a convex side), and rotating and transporting the recording medium 124, it is possible to prevent wrinkling or floating of the recording medium 124 from occurring and reliably prevent drying unevenness due to the wrinkling or floating.

The recording medium 124 on which a drying process is performed by the drying unit 118 is delivered from the drying drum 176 to the fixing drum 184 of the fixing unit 120 via the intermediate transportation unit 130.

(Fixing Unit)

The fixing unit 120 includes a fixing drum (also referred to as a "fixing trunk") 184, a halogen heater 186, a fixing roller 188, and an in-line sensor 190. The fixing drum 184 includes claw-shaped holding means (gripper) 185 on an outer peripheral surface thereof, similar to the processing liquid drum 154, and the tip of the recording medium 124 can be held by this holding means 185.

By the rotation of the fixing drum 184, the recording medium 124 is transported with the recording surface thereof directed outward, and preliminary heating using the halogen heater 186, a fixing process using the fixing roller 188, and inspection using the in-line sensor 190 are performed on this recording surface.

The halogen heater 186 is controlled to be at a predetermined temperature (for example, 180° C.). Accordingly, the preliminary heating of the recording medium 124 is performed.

The fixing roller 188 is a roller member that welds fine self-dispersible polymer particles in the ink by heating and pressurizing the dried ink to perform coating with the ink, and is configured to heat and pressurize the recording medium 124. Specifically, the fixing roller 188 is arranged to be pressurized against and brought into contact with the fixing drum 184 and constitutes a nip roller with the fixing drum 184. Accordingly, the recording medium 124 is interposed between the fixing roller 188 and the fixing drum 184 and nipped under predetermined nip pressure (for example, 0.15 MPa) such that the fixing process is achieved.

Further, the fixing roller 188 is configured as a heating roller in which a halogen lamp is incorporated in a metal pipe made of, for example, aluminum having good thermal conductivity, and is controlled to predetermined temperature (for example, 60° C. to 80° C.). By heating the recording medium 124 with this heating roller, thermal energy at a Tg temperature (glass transition point temperature) of a latex included in the ink or more is provided, and latex particles are melted. Accordingly, pushing and fixing to irregularities of the recording medium 124 is performed, and irregularities of the image surface are leveled, and glossiness is obtained.

Further, while the configuration in which only one fixing roller 188 is provided is adopted, a configuration in which a plurality of fixing rollers are provided according to an image layer thickness or a Tg characteristic of the latex particles may be adopted.

Meanwhile, the in-line sensor 190 is measurement means for measuring an ejection failure check pattern, an amount of moisture, a surface temperature, a gloss level, or the like for an image (including a test pattern or the like) recorded on the recording medium 124, and a charge coupled device (CCD) line sensor is applied.

According to the fixing unit 120 configured as above, since latex particles within a thin image layer formed in the drying unit 118 are heated and pressurized by the fixing roller 188, and melted, the latex particles can be fixed to the recording medium 124. Further, the surface temperature of the fixing drum 184 is set to 50° C. or more. By heating the recording medium 124 held on the outer peripheral surface of the fixing drum 184 from the back surface of the recording medium 124, the drying can be promoted, the image can be prevented from destructing at the time of fixing, and image intensity can be increased by effects of an increase in the image temperature.

In place of ink including a high boiling point solvent and polymer fine particles (thermoplastic resin particles), a monomer component that can be polymerized and cured by UV exposure may be contained. In this case, the ink-jet recording device 110 includes a UV exposure unit that exposes the ink on the recording medium 124 to UV light, in place of a heat pressure fixing unit (fixing roller 188) using a heat roller. Thus, in a case where ink including an active ray curable resin such as a UV curable resin is used, means for performing irradiation with active rays, such as a UV lamp or an ultraviolet ray LD (laser diode) array, is provided in place of the fixing roller 188 using heating fixing.

(Sheet Discharge Unit)

The sheet discharge unit 122 is provided subsequent to the fixing unit 120, as illustrated FIG. 7. The sheet discharge unit 122 includes a discharge tray 192. A transfer drum 194, a transportation belt 196, and a tension roller 198 are provided between the discharge tray 192 and the fixing drum 184 of the fixing unit 120 to come into contact with the discharge tray 192 and the fixing drum 184. The recording medium 124 is sent to the transportation belt 196 by the transfer drum 194 and discharged to the discharge tray 192. While details of a sheet transportation mechanism using the transportation belt 196 are not illustrated, a sheet tip of the recording medium 124 after print is held by a gripper of a bar (not illustrated) passed between portions of the endless transportation belt 196, and is transported onto the discharge tray 192 through rotation of the transportation belt 196.

Further, although not illustrated in FIG. 7, the ink-jet recording device 110 in this example includes an ink storage/loading unit that supplies the ink to each of the ink-jet heads 172M, 172K, 172C, and 172Y, and means for supplying the processing liquid to the processing liquid providing unit 114, in addition to the above configuration, and includes, for example, a head maintenance unit that performs cleaning (for example, wiping of a nozzle surface, purge, or nozzle suction) of each of the ink-jet heads 172M, 172K, 172C, and 172Y, a position detection sensor that detects a position of the recording medium 124 on a sheet transportation path, or a temperature sensor that detects temperature of each unit of the device.

<Description of Control System>

Figure 8:
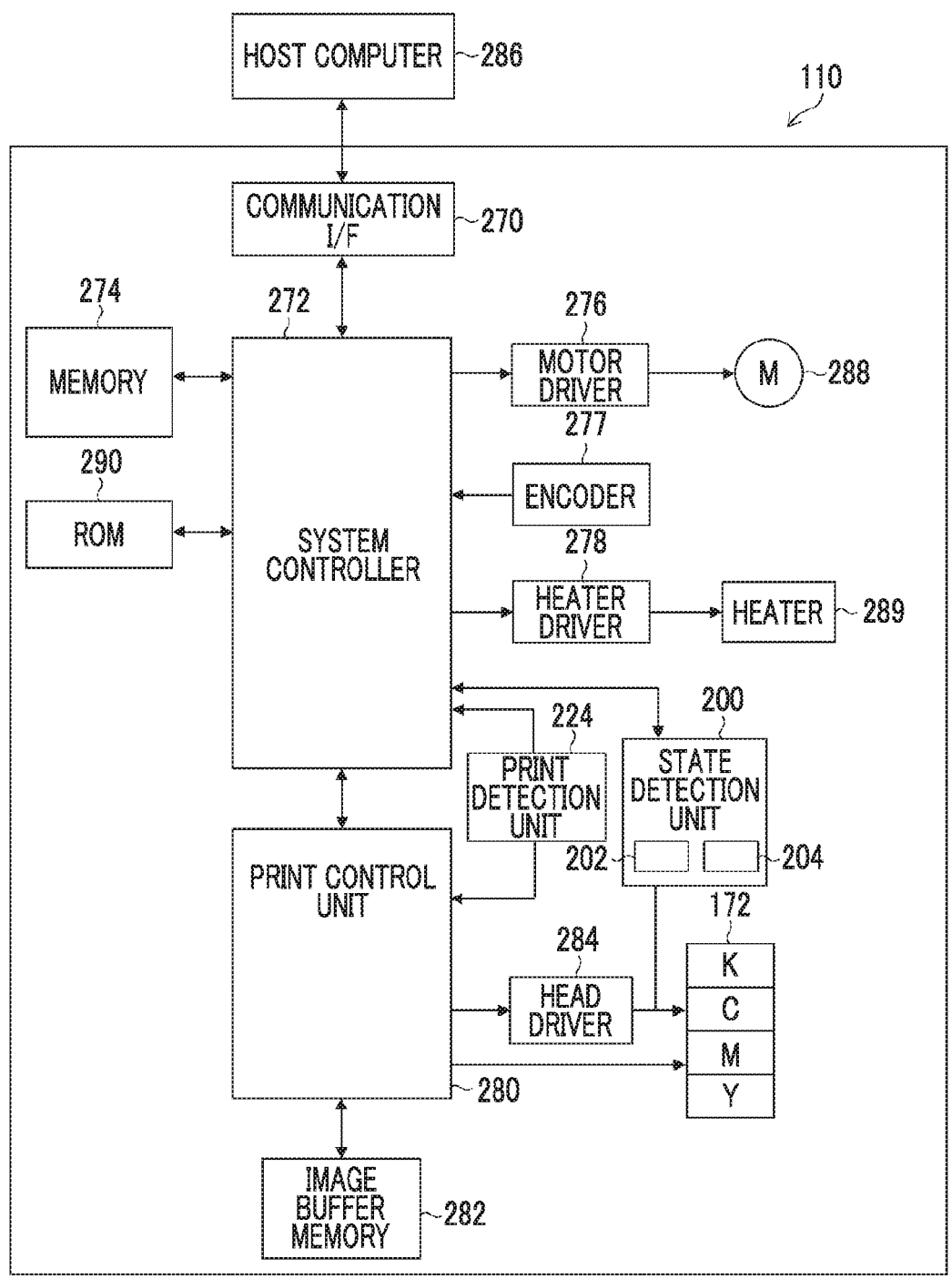
FIG. 8 is an essential unit block diagram illustrating a system configuration of the ink-jet recording device.

FIG. 8 is an essential unit block diagram illustrating a system configuration of the ink-jet recording device 110. The ink-jet recording device 110 includes, for example, a state detection unit 200, a communication interface 270, a system controller 272, a memory 274, a motor driver 276, a heater driver 278, a print control unit 280, an image buffer memory 282, and a head driver 284.

The communication interface 270 is an interface unit that receives image data sent from a host computer 286. A wired interface such as USB (Universal Serial Bus), IEEE1394, or Ethernet (registered trademark) or a wireless interface such as IEEE802.11 wireless local area network (LAN) or Bluetooth (registered trademark) may be applied to communication interface 270. A buffer memory (not illustrated) for speeding up communication may be mounted on the communication interface 270.

The image data sent from the host computer 286 is input to the ink-jet recording device 110 via the communication interface 270 and is stored in the memory 274 once.

The memory 274 is storage means that once stores the image input via the communication interface 270, and reading and writing of data from and to the memory 274 is performed through the system controller 272. The memory 274 is not limited to a memory including semiconductor elements, and a magnetic medium such as a hard disk may be used.

The system controller 272 includes a central processing unit (CPU) and peripheral circuits thereof, functions as a control device that controls the entire ink-jet recording device 110 according to a predetermined program, and functions as an operation unit that performs various operations. That is, the system controller 272 controls each of the units such as the communication interface 270, the memory 274, the motor driver 276, and the heater driver 278, performs control of communication with the host computer 286, control of reading and writing from or to the memory 274, or the like, and generates a control signal for controlling the motor 288 or the heater 289 in a transportation system.

Various control programs, various parameters, and the like are stored in a read only memory (ROM) 290, and the control programs are read and executed according to an instruction of the system controller 272.

The memory 274 is used as a temporary storage area for the image data and is also used as a development area of a program and an operation work area of the CPU.

The motor driver 276 is a driver that drives the motor 288 according to an instruction from the system controller 272. In FIG. 8, the motor is denoted with a reference numeral 288 as a representative to various motors arranged in the respective units in the device.

The heater driver 278 is a driver that drives the heater 289 according to an instruction from the system controller 272. In FIG. 8, the heater is denoted with a reference numeral 289 as a representative to various heaters arranged in the respective units in the device.

The print control unit 280 (an example of recording control means) is a control unit that has a signal processing function of performing processes such as various processes or corrections for generating a print control signal from the image data in the memory 274 according to control of the system controller 272, and supplies generated print data (dot image data) to the head driver 284.

The dot image data is generally generated by performing a color conversion process and half tone processing on multi-gradation image data. The color conversion process is a process of converting image data (for example, 8-bit image data for each of RGB colors) represented by sRGB or the like into color data of each color (in this example, color data of MKCY) of the ink used in the ink-jet recording device 110.

The half tone processing is a process of converting the color data of each color generated through the color conversion process into dot data of each color (in this example, dot data of MKCY) through a process such as an error diffusion method or a threshold matrix.

Required signal processing is performed in the print control unit 280, and control of an amount of ejection and an ejection timing of the ink droplet of the ink-jet heads 172M, 172K, 172C, and 172Y is performed through the head driver 284 based on the obtained dot data. Accordingly, a desired dot size or dot arrangement is realized.

The image buffer memory 282 is included in the print control unit 280, and data such as the image data or parameters at the time of image data processing in the print control unit 280 is temporarily stored in the image buffer memory 282. Further, an aspect in which the print control unit 280 and the system controller 272 are integrated as one processor is possible.

The head driver 284 includes the piezoactuator drive circuit 100 (see FIGS. 4 and 5). The head driver 284 may include a feedback control system for maintaining constant drive conditions of the ink-jet heads 172M, 172K, 172C, and 172Y.

The ink-jet recording device 110 illustrated in this example adopts a drive scheme in which a common drive waveform signal is applied to the piezoactuator 30 of each of the ink-jet heads 172M, 172K, 172C, and 172Y to switch ON/OFF of a switch element (not illustrated) connected to the individual electrode of each piezoactuator 30 according to an ejection timing of each piezoactuator 30 and, accordingly, to eject the ink from the nozzle 12 corresponding to each piezoactuator 30 is adopted.

The state detection unit 200 detects the output potential $V_{OUT}$ of the boost unit BST output from each piezoactuator drive circuit 100 of the head driver 284 to detect a short-circuit state of the piezoactuator 30 of the nozzle 12 of each of the ink-jet heads 172M, 172K, 172C, and 172Y and output a result of the detection to the system controller 272. The state detection unit 200 includes an analog multiplexer (not illustrated) that selects and outputs the desired output potential $V_{OUT}$ of the boost unit BST from among the input output potentials (potentials of the individual electrodes 28) $V_{OUT}$ of the respective boost units BST, an AD converter 202 that outputs a digital signal according to the selected and output output potential $V_{OUT}$ of the boost unit BST, and a table 204 for calculating the resistance value $R_L$ of the load resistor RL of the piezoactuator 30 based on the output digital signal.

The print detection unit 224 is a functional block that performs, for example, reading of the image recorded on the recording medium 124 in the ink-jet heads 172M, 172K, 172C, and 172Y and processing of read data, and provides predetermined information to the system controller 272. The print detection unit 224 includes the in-line sensor 190 illustrated in FIG. 7.

An encoder 277 detects the rotation speed of the drawing drum 170. For example, a rotary encoder using a photoelectric scheme is used. The system controller 272 calculates the rotation speed of the drawing drum 170 based on a signal from the encoder 277, generate an ejection timing signal for the nozzles 12 of the ink-jet heads 172M, 172K, 172C, and 172Y for respective colors based on the calculated rotation speed, and supplies the ejection timing signal to the print control unit 280.

Further, an aspect in which all or some of the processing functions of the system controller 272 are mounted on the host computer 286 is possible.

In the ink-jet recording device 110 configured as above, a short-circuit state of the nozzle 12 of each of the ink-jet heads 172M, 172K, 172C, and 172Y can be inspected by setting the state detection mode.

The technical range of the present invention is not limited to the range described in the above-described embodiments. The configurations or the like in the respective embodiments can be appropriately combined between the respective embodiments without departing from the gist of the present invention.

EXPLANATION OF REFERENCES

10: ink-jet head
12: nozzle
28: individual electrode
30: piezoactuator
32: common electrode
100: piezoactuator drive circuit
AMP: amplification unit
BST: boost unit
FET1, FET2: transistor
PIC1, PIC2: constant voltage source
R1 to R6: resistor
SW1, SW2: switch

What is claimed is:

1. A piezoelectric element drive circuit comprising:
a drive unit that feedback-amplifies a drive signal for driving a piezoelectric element that uses negative voltage drive and outputs the resultant drive signal to an individual electrode of the piezoelectric element, the drive unit including an input amplification unit to which the drive signal is input, and an output boost unit in which two complementary transistors having different polarities are push-pull connected;
a first power supply unit that supplies a first negative potential to the input amplification unit;
a second power supply unit different from the first power supply unit, the second power supply unit supplying a second negative potential to the output boost unit;
a first switch that switches the potential supplied to the input amplification unit from the first negative potential to a third negative potential having an absolute value smaller than that of the first negative potential;
a second switch that blocks the supply of the second negative potential from the second power supply unit to the output boost unit;
a third switch that connects the individual electrode of the piezoelectric element to a fourth negative potential via a first resistive element; and
an input unit to which a control signal for switching between a drive mode in which driving of the piezoelectric element is performed and a state detection mode in which detection of a state of the piezoelectric element is performed is input,
wherein in the drive mode, the potential supplied to the input amplification unit is set to the first negative potential, the second negative potential is supplied from the second power supply unit to the output boost unit, and the individual electrode of the piezoelectric element is not connected to the fourth negative potential via the first resistive element, and
in the state detection mode, the potential supplied to the input amplification unit is set to the third negative potential, the supply of the second negative potential from the second power supply unit to the output boost unit is blocked, and the individual electrode of the piezoelectric element is connected to the fourth negative potential via the first resistive element.

2. The piezoelectric element drive circuit according to claim 1,
wherein the first power supply unit performs feedback control based on a voltage obtained by dividing an output voltage generated from a positive voltage through resistance division and supplies a first negative potential, and
the first switch changes a resistance value of the resistance division and switches the first negative potential to the third negative potential.

3. The piezoelectric element drive circuit according to claim 2,
wherein the first switch changes the resistance value by inserting a resistor in parallel with a resistive element for the resistance division.

4. The piezoelectric element drive circuit according to claim 1,
wherein a potential difference between a ground potential and the third negative potential is smaller than a maximum rating of a gate-source voltage of the transistor.

5. The piezoelectric element drive circuit according to claim 1,
wherein the input amplification unit includes an operational amplifier that performs inversion amplification.

6. The piezoelectric element drive circuit according to claim 1, further comprising:
an AD converter that outputs a digital signal according to a potential of the individual electrode of the piezoelectric element.

7. The piezoelectric element drive circuit according to claim 6, further comprising:
a table for calculating load resistance of the piezoelectric element from the output digital signal.

8. The piezoelectric element drive circuit according to claim 1,
wherein the fourth negative potential is the second negative potential supplied by the second power supply unit.

9. An image recording device comprising:
the piezoelectric element drive circuit according to claim 1;

a recording head having the piezoelectric element that uses negative voltage drive;

a moving unit that relatively moves the recording head and the recording medium; and a recording control unit that controls the recording head and records an image on the recording medium.

10. A state detection method of a piezoelectric element in a piezoelectric element drive circuit including a drive unit that feedback-amplifies a drive signal for driving a piezoelectric element that uses negative voltage drive and outputs the resultant drive signal to an individual electrode of the piezoelectric element, the drive unit including an input amplification unit to which the drive signal is input, and an output boost unit in which two complementary transistors having different polarities are push-pull connected, a first power supply unit that supplies a first negative potential to the input amplification unit, and a second power supply unit different from the first power supply unit, the second power supply unit supplying a second negative potential to the output boost unit, the state detection method comprising the processes of:

switching the potential supplied to the input amplification unit from the first negative potential to a third negative potential having an absolute value smaller than that of the first negative potential;

blocking the supply of the second negative potential from the second power supply unit to the output boost unit;

pulling down the individual electrode of the piezoelectric element to a fourth negative potential using a first resistive element; and detecting a state of the piezoelectric element in a state in which the potential supplied to the input amplification unit is set to the third negative potential, supply of the second negative potential from the second power supply unit to the output boost unit is blocked, and the individual electrode of the piezoelectric element is pulled down to the fourth negative potential using the first resistive element.

* * * * *